United States Patent [19]

Dukes et al.

[11] Patent Number: 5,781,791
[45] Date of Patent: Jul. 14, 1998

[54] DIGITAL MICROELECTRONIC CIRCUIT PACKAGE USING BUFFER DIES AND PROGRAMMABLE DEVICE OR MEMORY DIES

[75] Inventors: Michael A. Dukes, Austin, Tex.; Kenneth J. Keyes, Jr., Long Branch; Gerald T. Michael, Ocean, both of N.J.

[73] Assignee: The United States of America as represented by the Secretary of the Army, Washington, D.C.

[21] Appl. No.: 636,996

[22] Filed: Apr. 16, 1996

[51] Int. Cl.$^6$ .................................................... G06F 13/00
[52] U.S. Cl. ........................................ 395/800.32; 361/736
[58] Field of Search ...................... 395/800.01, 800.32, 395/833, 282, 283, 182.03, 183–19; 326/21, 37; 361/728, 736, 748; 257/202, 499

[56] References Cited

U.S. PATENT DOCUMENTS

| | | | |
|---|---|---|---|
| 5,016,086 | 5/1991 | Inoue et al. | 257/690 |
| 5,034,634 | 7/1991 | Yamamoto | 326/38 |
| 5,184,284 | 2/1993 | Ashelin et al. | 361/783 |
| 5,203,659 | 4/1993 | Schweitzer et al. | 414/226 |
| 5,448,165 | 9/1995 | Hodge et al. | 324/581 |
| 5,625,227 | 4/1997 | Estes et al. | 257/712 |
| 5,641,978 | 6/1997 | Jassowski | 257/208 |
| 5,644,161 | 7/1997 | Burns | 257/668 |
| 5,648,893 | 7/1997 | Loo et al. | 361/280 |
| 5,691,041 | 11/1997 | Frankeny et al. | 428/209 |
| 5,698,895 | 12/1997 | Pedersen et al. | 257/665 |

OTHER PUBLICATIONS

Glasser, Lance A. and Daniel W. Dobberpuhl. *The Design and Analysis of VLSI Circuits*. Reading: Addison–Wesley Publishing Company. 1985.

Keys, Kenneth J. and Michael A. Dukes. *A VHDL to Altera FPGA Translator for Obsolete Integrated Circuit Emulation*, in *Proceedings of Advances in Modeling and Simulation Conference*, Redstone Arsenal, Alabama, 26–28 Apr., 1994.

Lin, Wen C. *Handbook of Digital System Design*. Boca Raton: CRC Press, 1990.

*Primary Examiner*—Alpesh M. Shah
*Attorney, Agent, or Firm*—Michael Zelenka; William H. Anderson; George B. Tereschuk

[57] ABSTRACT

A digital microelectronic replacement package includes at least one buffer die in combination with a programmable device or memory. The buffer die performs the functions of impedance-matching, delay-matching, and voltage-matching, while the programmable device or memory can be used to emulate the logic and/or storage functions of the original digital microelectronic circuit; the package of the invention can be used as a direct replacement for a digital microelectronic circuit without the requirement that the original circuit board be redesigned to accommodate modern voltage, impedance, and delay specifications associated with the programmable device or memory.

12 Claims, 1 Drawing Sheet

5,781,791

1

DIGITAL MICROELECTRONIC CIRCUIT PACKAGE USING BUFFER DIES AND PROGRAMMABLE DEVICE OR MEMORY DIES

GOVERNMENT INTEREST

The invention described herein may be manufactured, used, imported and licensed by or for the Government for the United States of America without the payment to us of any royalty thereon.

FIELD OF THE INVENTION

The invention relates in general to digital microelectronic circuits, and in particular to a circuit package for integrated circuit replacement parts.

BACKGROUND OF THE INVENTION

Programmable devices and memories bought off-the-shelf have generally had limited pin voltage application. Further, the delay and impedance of a chosen programmable device or memory are relatively fixed to a given range. As the development of electronic systems has progressed, supply voltages have typically dropped and chip speed has increased. Therefore, a chip manufactured from a process line today may not function reliably in a system from several years ago.

These incompatibilities have been especially problematic in the areas of reverse-engineered electronics and maintaining/sustaining systems in the field. In the case of a failed system, replacing a digital microelectronic circuit may be all that is required to make the system function again. However, a digital microelectronic circuit from an old system may no longer be available from an original or replacement-parts manufacturer. Primarily, this occurs when the original system has application-specific integrated circuits (ASICs) for a system which is 5 to 10 years of age, or has other digital microelectronic circuits for a system 5 to 20 years of age.

Where the digital microelectronic circuit is no longer available, the system's PC board or subsystem must be altered or redesigned to accommodate an on-board programmable device or memory and on-board voltage/impedance/delay-matching buffers so that the programmable device or memory will function properly. This process incurs greater cost and possible resupply delays, since an entire board must be redesigned and tested to ensure no errors were introduced from the board redesign. Further, a new board or subsystem is introduced into the supply system.

OBJECTS AND SUMMARY OF THE INVENTION

It is therefore an object of the invention to provide a microelectronic circuit package with improved compatibility characteristics.

The invention provides a digital microelectronic circuit replacement package which matches the form, fit, and function of the original part by employing at least one buffer die in combination with a programmable device or memory. The buffer die performs the functions of impedance-matching, delay-matching, and voltage-matching, while the programmable device or memory can be used to emulate the logic and/or storage functions of the original digital microelectronic circuit; the package of the invention can be used as a direct replacement for a digital microelectronic circuit without the requirement that the original circuit board be redesigned to accommodate modern voltage, impedance, and delay specifications associated with the programmable device or memory.

BRIEF DESCRIPTION OF THE DRAWINGS

These and other objects, features, and details of the invention will become apparent in light of the ensuing detailed disclosure, and particularly in light of the drawings wherein.

DESCRIPTION OF THE PREFERRED EMBODIMENTS

Figure 1:
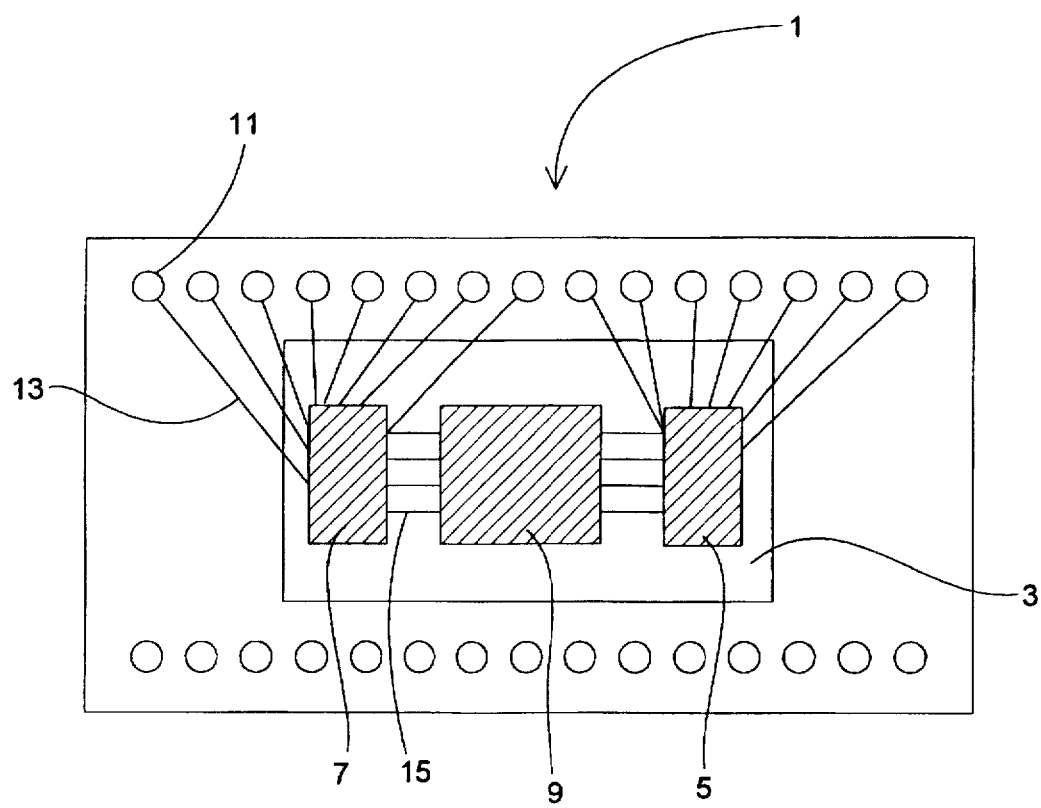
FIG. 1 illustrates a schematic view of the invention according to a preferred embodiment.

With reference to FIG. 1, a package 1 includes a substrate 3 having mounted thereon buffers 5, 7, and a Digital Microelectronic Circuit (DMC) 9. According to preferred embodiments of the invention, the DMC 9 is either a programmable device or a memory, depending upon the specific application. The classes of programmable devices which are preferably used include, but are not limited to, programmable logic devices, field-programmable gate arrays, and synthesized circuits. The classes of memories which are preferably used include, but are not limited to, random-access memories, read-only memories, and programmable read-only memories.

Pins 11 are provided on the package and are wired to the internal buffer dies via wiring 13. The pins 11 function as an interface from a board or DMC mount to the internal buffer dies. The internal buffer dies are in turn wired to the DMC 9.

The buffer dies are preferably designed to perform the functions of impedance-matching, delay-matching, and voltage-matching. However, it should be noted that, in applications where one or more of those functions is not required, the buffer dies of the invention need not perform that function. Further, although one DMC 9 is shown in the embodiment of FIG. 1, more than one DMC may be used for the space provided. And, although a dual in-line package (DIP) is shown, a pin-grid array (PGA) package could also be modified in a manner similar to that shown in FIG. 1 without departing from the spirit and scope of the invention. Any packaging that contains a cavity for the mounting of a die can be used in the manner described herein.

The invention provides a mechanism for fast production of replacement parts, on demand, that can be programmed for any application and mounted in a chip package conforming to the appropriate application's voltage, impedance, and delay characteristics. The invention permits use of developments in multi-chip module (MCM) manufacturing processes, and allows systems to take advantage of developments in low-power designs and reliability by providing a replacement part that uses less power and has a greater mean-time between failure. By replacing a single DMC with another DMC which has the form, fit, and function of the original DMC, a major board redesign effort is avoided, permitting more obsolete part problems to be addressed.

The number of gates that can be handled by the package of the invention is limited by the capacity of the programmable device or memory employed. However, in most cases, the number of gates required by the old technology will fall within the capacity of the available programmable devices and memories.

The invention provides significant advantages to companies with an investment in expensive, durable-item goods that contain systems made up of DMCs integrated with other equipment. Examples of such equipment include, e.g., aircraft, construction, and other factory-equipment.

What is claimed is:

1. A replacement digital microelectronic circuit package for replacing an original microelectronic circuit package on a circuit board, comprising:

pin means for operably connecting to said circuit board;

at least one substrate;

at least one buffer die mounted on said substrate, said buffer die being operably connected to said pin means; and, at least one programmable device mounted on said substrate, said programmable device being operably connected to said buffer die, whereby said buffer die performs at least one of the functions of voltage-matching, impedance-matching, or delay-matching.

2. The device according to claim 1, wherein said programmable device comprises a programmable logic device.

3. The device according to claim 1, wherein said programmable device comprises a field-programmable gate array.

4. The device according to claim 1, wherein said programmable device comprises a synthesized circuit.

5. A replacement digital microelectronic circuit package for replacing an original microelectronic circuit on a circuit board, comprising:

pin means for operably connecting to said circuit board;

at least one substrate;

at least one buffer die mounted on said substrate, said buffer die being operably connected to said pin means; and, at least one memory device mounted on said substrate, said memory device being operably connected to said buffer die, whereby said buffer die performs at least one of the functions of voltage-matching, impedance-matching, or delay-matching.

6. The device according to claim 5, wherein said memory device comprises a random-access memory.

7. The device according to claim 5, wherein said memory device comprises a read-only memory.

8. The device according to claim 5, wherein said memory device comprises a programmable read-only memory.

9. A method of replacing a digital microelectronic circuit, comprising the steps of:

removing a first digital microelectronic circuit from a circuit board;

replacing said first digital microelectronic circuit with a circuit package having therein a second digital microelectronic circuit and at least one buffer die;

using said buffer die to match a first voltage level from said circuit board to a second voltage level required by said second digital microelectronic circuit.

10. A method of replacing a digital microelectronic circuit, comprising the steps of:

removing a first digital microelectronic circuit from a circuit board;

replacing said first digital microelectronic circuit with a circuit package having therein a second digital microelectronic circuit and at least one buffer die;

using said buffer die to match a first delay from said circuit board to a second delay required by said second digital microelectronic circuit.

11. A method of replacing a digital microelectronic circuit, comprising the steps of:

removing a first digital microelectronic circuit from a circuit board;

replacing said first digital microelectronic circuit with a circuit package having therein a second digital microelectronic circuit and at least one buffer die;

using said buffer die to match a first impedance level from said circuit board to a second impedance level required by said second digital microelectronic circuit.

12. A method of replacing a digital microelectronic circuit, comprising the steps of:

removing a first digital microelectronic circuit from a circuit board;

replacing said first digital microelectronic circuit with a circuit package having therein a second digital microelectronic circuit and at least one buffer die;

using said buffer die to perform the functions of impedance-matching, delay-matching, and voltage-matching, whereby said second digital microelectronic circuit can be used to perform functions previously performed by said first digital microelectronic circuit.

* * * * *